US012579334B2

(12) United States Patent　　　(10) Patent No.:　US 12,579,334 B2

Chu et al.　　　(45) Date of Patent:　Mar. 17, 2026

(54) METHOD FOR DETERMINING TEST EVALUATION INFORMATION, DEVICE, ELECTRONIC DEVICE, AND COMPUTER STORAGE MEDIUM

(71) Applicants: China Intelligent and Connected Vehicles (Beijing) Research Institute Co., Ltd., Beijing (CN); Tsinghua University, Beijing (CN)

(72) Inventors: Wenbo Chu, Beijing (CN); Keqiang Li, Beijing (CN); Shuang Wan, Beijing (CN); Dalong Fang, Beijing (CN); Guanfu Huang, Beijing (CN); Xiaoping Du, Beijing (CN)

(73) Assignees: CHINA INTELLIGENT AND CONNECTED VEHICLES (BEIJING) RESEARCH INSTITUTE CO., LTD., Beijing (CN); Tsinghua University, Beijing (CN)

( * ) Notice: Subject to any disclaimer, the term of this patent is extended or adjusted under 35 U.S.C. 154(b) by 1114 days.

(21) Appl. No.: 17/623,586

(22) PCT Filed: May 27, 2021

(86) PCT No.: PCT/CN2021/096317
　　§ 371 (c)(1),
　　(2) Date: Dec. 28, 2021

(87) PCT Pub. No.: WO2022/121248
　　PCT Pub. Date: Jun. 16, 2022

(65) Prior Publication Data
　　US 2023/0325550 A1　　Oct. 12, 2023

(30) Foreign Application Priority Data

Dec. 11, 2020　(CN) ........................ 202011439869.8

(51) Int. Cl.
　　*G06F 30/15*　　　(2020.01)

(52) U.S. Cl.
　　CPC ................................... *G06F 30/15* (2020.01)

(58) Field of Classification Search
　　CPC ...... G06F 30/17; G06F 30/12; G06F 2111/00;
　　　　　　　　G06F 2119/22; G06F 30/15
　　See application file for complete search history.

(56) References Cited

U.S. PATENT DOCUMENTS

2018/0017950 A1　　1/2018　Zhang et al.
2019/0382140 A1*　12/2019　Giroux ............. G01R 31/31924

FOREIGN PATENT DOCUMENTS

CN　　108646586 A　　10/2018
CN　　108683559 A　　10/2018
　　　　　　(Continued)

OTHER PUBLICATIONS

Z. Li, M. Kyle, B. Johnson, "Hardware-in-the-loop Real-Time Simulation Interface Software Design", pp. 1012-1017, 2004 IEEE. (Year: 2004).*
　　　　　　(Continued)

*Primary Examiner* — Kibrom K Gebresilassie

(57)　　　　　　ABSTRACT

A method for determining test evaluation information includes: building a hardware-in-the-loop test environment, wherein the hardware-in-the-loop test environment comprises a cloud control platform under test, a road traffic scenario simulation platform, and a real-time simulator, and wherein the road traffic scenario simulation platform is configured to build a variety of road traffic scenarios, the real-time simulator is configured to realize communication between the cloud control platform under test and respective interface boards; determining a test scenario according to a function to be realized by the cloud control platform under test; performing a test operation on the cloud control platform under test based on the hardware-in-the-loop test
　　　　　　(Continued)

building a hardware-in-the-loop test environment, wherein the hardware-in-the-loop test environment comprises a cloud control platform under test, a road traffic scenario simulation platform, and a real-time simulator, and wherein the road traffic scenario simulation platform is configured to build a variety of road traffic scenarios, the real-time simulator is configured to realize communication between the cloud control platform under test and respective interface boards　　S101 determining a test scenario according to a function to be realized by the cloud control platform under test　　S102 performing a test operation on the cloud control platform under test based on the hardware-in-the-loop test environment and the test scenario, and collecting functional parameters of the cloud control platform under test　　S103 determining test evaluation information of the cloud control platform under test based on the functional parameters　　S104 environment and the test scenario, and collecting functional parameters of the cloud control platform under test; and determining test evaluation information of the cloud control platform under test based on the functional parameters.

16 Claims, 4 Drawing Sheets

(56) References Cited

FOREIGN PATENT DOCUMENTS

| | | | |
|---|---|---|---|
| CN | 108897240 | A | 11/2018 |
| CN | 110162003 | A | 8/2019 |
| CN | 110798449 | A | 2/2020 |
| CN | 111338973 | A | 6/2020 |
| CN | 111752769 | A | 10/2020 |
| CN | 112034820 | A | 12/2020 |
| CN | 112631246 | A | 4/2021 |
| KR | 20140123608 | A | 10/2014 |

OTHER PUBLICATIONS

Y. Chen, T. Zhang, S. Zhang, N. Zheng, "Autonomous Vehicle Testing and Validation Platform: Integrated Simulation System with Hardware in the Loop", pp. 949-955, 2018 IEEE (Year: 2018).*
International Search Report dated Sep. 9, 2021 for PCT Application No. PCT/CN2021/096317.
Office Action dated Sep. 1, 2021 for Chinese application No. 202011439869.8.

* cited by examiner

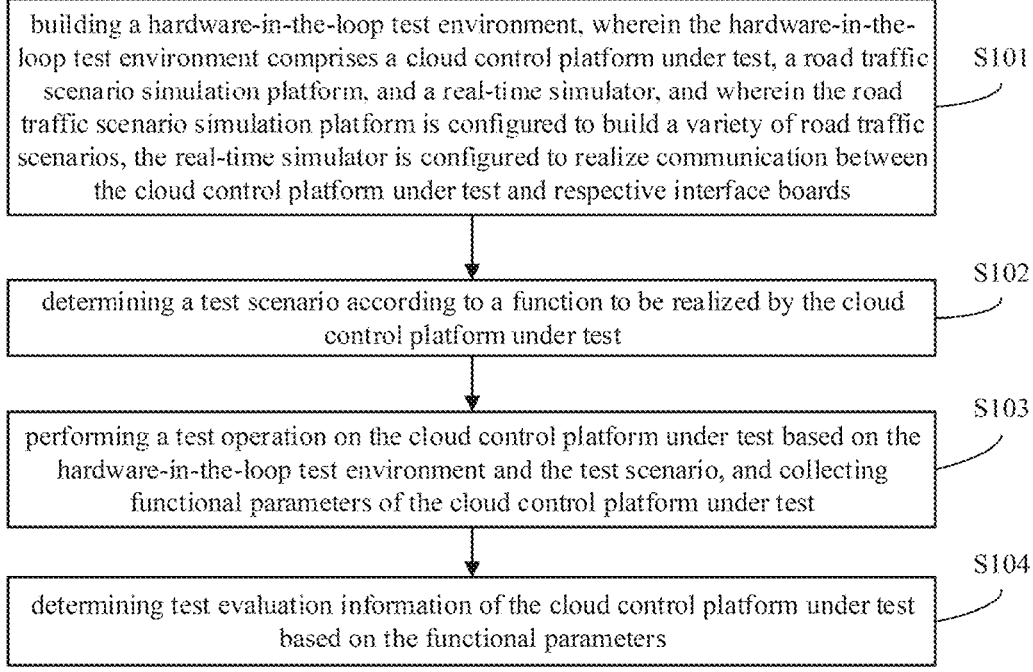

building a hardware-in-the-loop test environment, wherein the hardware-in-the-loop test environment comprises a cloud control platform under test, a road traffic scenario simulation platform, and a real-time simulator, and wherein the road traffic scenario simulation platform is configured to build a variety of road traffic scenarios, the real-time simulator is configured to realize communication between the cloud control platform under test and respective interface boards      S101 determining a test scenario according to a function to be realized by the cloud control platform under test      S102 performing a test operation on the cloud control platform under test based on the hardware-in-the-loop test environment and the test scenario, and collecting functional parameters of the cloud control platform under test      S103 determining test evaluation information of the cloud control platform under test based on the functional parameters      S104

Fig. 1

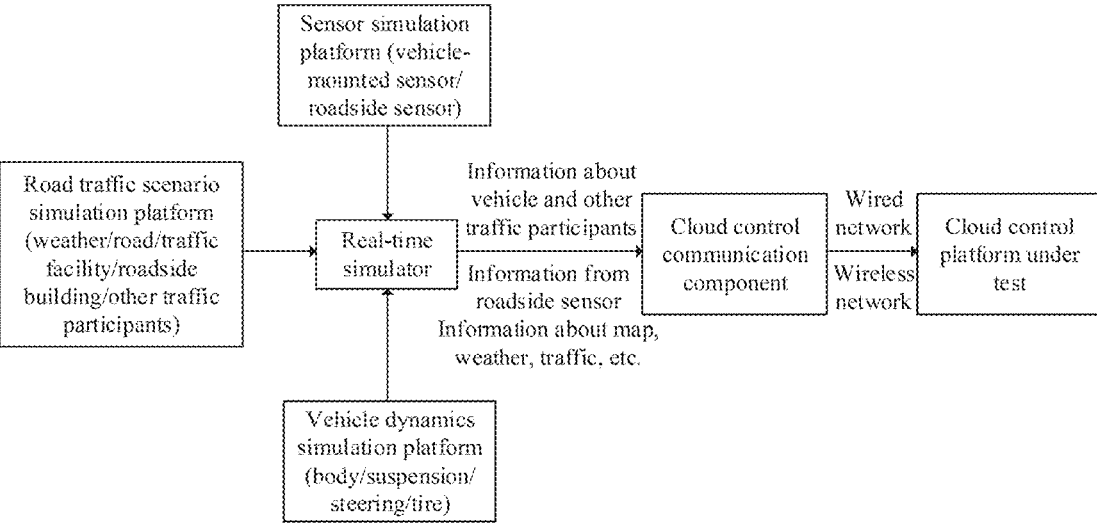

Sensor simulation platform (vehicle-mounted sensor/ roadside sensor)

Road traffic scenario simulation platform (weather/road/traffic facility/roadside building/other traffic participants)

Real-time simulator

Information about vehicle and other traffic participants

Information from roadside sensor

Information about map, weather, traffic, etc.

Cloud control communication component

Wired network

Wireless network

Cloud control platform under test

Vehicle dynamics simulation platform (body/suspension/ steering/tire)

Fig. 2

METHOD FOR DETERMINING TEST EVALUATION INFORMATION, DEVICE, ELECTRONIC DEVICE, AND COMPUTER STORAGE MEDIUM

CROSS-REFERENCE TO RELATED APPLICATIONS

The application is a national stage of an international application No. PCT/CN2021/096317 file on May 27, 2021, which claims priority of Chinese Patent Application No. 202011439869.8 filed in China on Dec. 11, 2020, both of which are incorporated herein by reference in their entireties.

TECHNICAL FIELD

The application relates to the technical field of test of a cloud control platform, and in particular to a method, a device, an equipment for determining test evaluation information as well as a computer storage medium.

BACKGROUND

With industrial upgrading of "four modernizations" of automotive, intelligent connected vehicles have become a development direction of future vehicles. A cloud control platform is a basic platform supporting the development of intelligent connected vehicles. It has a complex cyber-physical system, involving multiple disciplines such as transportation, automotive, communication, and electronics. The cloud control platform is composed of a cloud control basic platform and a cloud control application platform. The platform forms a cloud control system with intelligent connected vehicles, other traffic participants, roadside infrastructure, communication networks, and mainly realizes a coordinated control of a "person-vehicle-road-cloud" system, provides services such as enhanced safety and improved energy efficiency for vehicles, realizes an autonomous control of all traffic participants, and realized overall traffic and vehicle management and optimization. The industry has reached a preliminary consensus on a system architecture of the cloud control platform, but it requires large-scale testing to achieve mature technology of the cloud control platform.

A traditional method for testing a cloud control platform includes a real vehicle test and a simulation test. The real vehicle test is to build a communication base station in a test area, install roadside equipment at intersections in the test area, arrange some buildings that block signals in the test area, set a vehicle and other traffic participants in advance in the test area, and tests interaction functions between the cloud control platform and the other traffic participants, between the cloud control platform and infrastructure and between the cloud control platform and the vehicle. The simulation test is to simulate information interaction processes among the vehicle, the other traffic participants, roadside facilities, communication networks and the cloud control platform by means of simulation, thereby testing functions of the cloud control platform.

The real vehicle test can test both functions and performance of the cloud control platform, but application scenarios of the cloud control platform are complex and difficult to exhaust. Therefore, the real vehicle test alone cannot meet test requirements, and moreover the real vehicle test has problems such as lower efficiency, high cost, and unrepeatable test cases. The simulation test can improve test efficiency, reduce test cost, and enable repeatable test cases, and is widely used in a test verification phase of system software development, but the simulation test only performs a test on software, cannot performs a test on a real software and hardware integration system. The system test has a limited degree of approximation to a real scene, its real-time performance cannot meet requirements, and its credibility is insufficient, resulting in inability to accurately determine test evaluation information of the cloud control platform.

Therefore, how to more accurately determine test evaluation information of the cloud control platform is a technical problem that needs to be solved urgently by those skilled in the art.

SUMMARY

The embodiments of the present application provide a method, a device and an equipment for determining test evaluation information as well as a computer storage medium, which can more accurately determine test evaluation information of a cloud control platform.

In a first aspect, an embodiment of the present application provides a method for determining test evaluation information, including: building a hardware-in-the-loop test environment, wherein the hardware-in-the-loop test environment comprises a cloud control platform under test, a road traffic scenario simulation platform, and a real-time simulator, and wherein the road traffic scenario simulation platform is configured to build a variety of road traffic scenarios, the real-time simulator is configured to realize communication between the cloud control platform under test and respective interface boards; determining a test scenario according to a function to be realized by the cloud control platform under test; performing a test operation on the cloud control platform under test based on the hardware-in-the-loop test environment and the test scenario, and collecting functional parameters of the cloud control platform under test; and determining test evaluation information of the cloud control platform under test based on the functional parameters.

In an embodiment, the hardware-in-the-loop test environment may further include a vehicle dynamics simulation platform configured to simulate a response of a vehicle to a driver, a road surface and an aerodynamic input, and to predict and simulate handling stability, braking performance and dynamic performance of the vehicle.

In an embodiment, the hardware-in-the-loop test environment may further include a sensor simulation platform configured to simulate output of different types of sensors.

In an embodiment, the different types of sensors may include a vehicle-mounted sensor and a roadside sensor.

In an embodiment, the hardware-in-the-loop test environment may further include a cloud control communication component simulation platform configured to build a communication network for the cloud control platform under test.

In an embodiment, the functional parameters may include a vehicle driving safety parameter, a traffic operation efficiency parameter and a cloud control system function completion degree parameter.

In an embodiment, the determination of the test scenario according to the function to be realized by the cloud control platform under test may include: determining a test case according to the function to be realized by the cloud control platform under test; and determining a corresponding test scenario according to the test case.

In a second aspect, an embodiment of the present application provides a device for determining test evaluation information, including: a building module configured to build a hardware-in-the-loop test environment, wherein the hardware-in-the-loop test environment comprises a cloud control platform under test, a road traffic scenario simulation platform, and a real-time simulator, and wherein the road traffic scenario simulation platform is configured to build a variety of road traffic scenarios, the real-time simulator is configured to realize communication between the cloud control platform under test and respective interface boards; a first determination module configured to determine a test scenario according to a function to be realized by the cloud control platform under test; a test module configured to perform a test operation on the cloud control platform under test based on the hardware-in-the-loop test environment and the test scenario, and collect functional parameters of the cloud control platform under test; and a second determination module configured to determine test evaluation information of the cloud control platform under test based on the functional parameters.

In an embodiment, the hardware-in-the-loop test environment may further include a vehicle dynamics simulation platform configured to simulate a response of a vehicle to a driver, a road surface and an aerodynamic input, and to predict and simulate handling stability, braking performance and dynamic performance of the vehicle.

In an embodiment, the hardware-in-the-loop test environment may further include a sensor simulation platform configured to simulate output of different types of sensors.

In an embodiment, the different types of sensors may include a vehicle-mounted sensor and a roadside sensor.

In an embodiment, the hardware-in-the-loop test environment may further include a cloud control communication component simulation platform configured to build a communication network for the cloud control platform under test.

In an embodiment, the functional parameters may include a vehicle driving safety parameter, a traffic operation efficiency parameter and a cloud control system function completion degree parameter.

In an embodiment, the first determination module may include: a first determination unit configured to determine a test case according to the function to be realized by the cloud control platform under test; and a second determination unit configured to determine a corresponding test scenario according to the test case.

In a third aspect, the embodiments of the present application provide an electric device. The electric device includes: a processor; and a memory storing computer program instructions, wherein the processor is configured to execute the computer program instructions to perform the method for determining test evaluation information according to the first aspect.

In a fourth aspect, the embodiments of the present application provides a computer storage medium with computer program instructions stored thereon, wherein the computer program instructions are executed by a processor to perform the method for determining test evaluation information according to the first aspect.

BRIEF DESCRIPTION OF THE DRAWINGS

In order to explain technical solutions of the embodiments of the present application more clearly, the drawings that need to be used in the embodiments of the present application will be briefly discussed below. For those skilled in the art, other drawings can be obtained from these drawings without inventive efforts.

FIG. 1 is a schematic flowchart of a method for determining test evaluation information according to an embodiment of the present application;

FIG. 2 is a schematic structural diagram of a hardware-in-the-loop test system for a cloud control platform in which the method for determining test evaluation information according to an embodiment of the present application is applicable.

DETAILED DESCRIPTION

Figure 3:
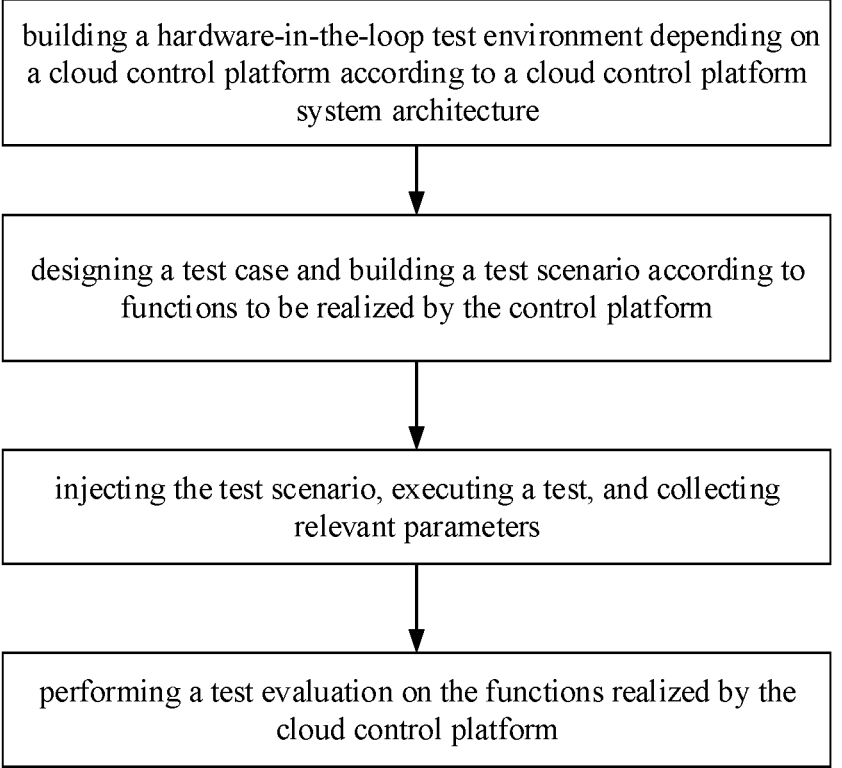
FIG. 3 is a schematic diagram of a hardware-in-the-loop test process in which the method for determining test evaluation information according to an embodiment of the present application is applied.

The features and exemplary embodiments of various aspects of the present application will be described in detail below. In order to make the purpose, technical solutions, and advantages of the present application clearer, the present application will be described in detail with reference to the accompanying drawings and specific embodiments. It should be understood that the specific embodiments described herein are only intended to explain the present application, but not to limit the application. For those skilled in the art, the present application can be implemented without some of these specific details. The following description of the embodiments is only to provide a better understanding of the present application by showing examples of the present application.

It should be noted that relational terms such as first and second herein are only used to distinguish one entity or operation from another entity or operation, and do not necessarily require or imply these entities or operations must have such actual relationship or order therebetween. Moreover, the terms "include", "comprise" or any other variants thereof are intended to cover non-exclusive inclusion, so that a process, method, article, or device including a series of elements may not only include those elements, but also include other elements that are not explicitly listed, or also include elements inherent to the process, method, article or device. Otherwise particularly stated, an element defined by the expression "including . . . " do not exclude existence of other same elements in a process, method, article, or deice that includes the element.

In order to solve the existing technical problems, the embodiments of the present application provide a method, a device and an equipment for determining test evaluation information as well as computer storage medium. The method for determining test evaluation information according to the embodiments of the present application will be firstly discussed below.

FIG. 1 shows a schematic flowchart of a method for determining test evaluation information according to an embodiment of the present application. As shown in FIG. 1, the method for determining test evaluation information includes:

S101: building a hardware-in-the-loop test environment, wherein the hardware-in-the-loop test environment includes a cloud control platform under test, a road traffic scenario simulation platform, and a real-time simulator, and wherein the road traffic scenario simulation platform is configured to build a variety of road traffic scenarios, the real-time simulator is configured to realize communication between the cloud control platform under test and respective interface boards.

In one embodiment, the hardware-in-the-loop test environment may further include a vehicle dynamics simulation platform configured to simulate a response of a vehicle to a driver, a road surface and an aerodynamic input, and to predict and simulate handling stability, braking performance and dynamic performance of the vehicle.

In one embodiment, the hardware-in-the-loop test environment may further include a sensor simulation platform configured to simulate output of different types of sensors.

In one embodiment, the different types of sensors include a vehicle-mounted sensor and a roadside sensor.

In one embodiment, the hardware-in-the-loop test environment may further include a cloud control communication component simulation platform configured to build a communication network for the cloud control platform under test.

The method for determining test evaluation information further includes S102: determining a test scenario according to a function to be realized by the cloud control platform under test.

In one embodiment, the determination of the test scenario according to the function to be realized by the cloud control platform under test may include: determining a test case according to the function to be realized by the cloud control platform under test; and determining a corresponding test scenario according to the test case.

The method for determining test evaluation information further includes S103: performing a test operation on the cloud control platform under test based on the hardware-in-the-loop test environment and the test scenario, and collecting functional parameters of the cloud control platform under test.

In one embodiment, the functional parameters may include a vehicle driving safety parameter, a traffic operation efficiency parameter and a cloud control system function completion degree parameter.

The method for determining test evaluation information further includes S104: determining test evaluation information of the cloud control platform under test based on the functional parameters.

According to the method for determining test evaluation information, a hardware-in-the-loop test environment is built; a test scenario is determined according to a function to be realized by the cloud control platform under test; a test operation on the cloud control platform under test is performed based on the hardware-in-the-loop test environment and the test scenario, and functional parameters of the cloud control platform under test are collected; and test evaluation information of the cloud control platform under test is determined based on the functional parameters. Since the hardware-in-the-loop test environment includes a cloud control platform under test, a road traffic scenario simulation platform and a real-time simulator, and the road traffic scenario simulation platform is configured to build a variety of road traffic scenarios and the real-time simulator is configured to realize communication between the cloud control platform under test and respective interface boards, test evaluation information of the cloud control platform can be more accurately determined.

The hardware-in-the-loop is a semi-physical test method, which performs a hardware-in-the-loop test to verify a test on the cloud control platform and thus can solve the problems of lower efficiency and unrepeatable test cases and scenarios of the existing real vehicle test, and performs the test on a real software and hardware integration system, and thus can test a real-time response of the system to a real external input as well as functions and performance of the software and hardware integration system, thereby authenticity and effectiveness of the test can be improved, and the problem of insufficient credibility of the simulation test can be solved.

In the following, the method for determining test evaluation information according to the embodiments of the present application will be described as a whole.

The embodiments of the application conducts a hardware-in-the-loop test on the cloud control platform, to mainly test interaction functions between the cloud control platform and other traffic participants, between the cloud control platform and infrastructure, and between the cloud control and autonomous vehicles.

As shown in FIG. 2, the hardware-in-the-loop test system for the cloud control platform may mainly include six parts: a road traffic scenario simulation platform, a vehicle dynamics simulation platform, a sensor simulation platform, a cloud control communication component simulation platform, a real-time simulator, and a cloud control platform under test.

The road traffic scenario simulation platform is mainly configured to build an application scenario in which the cloud control platform operates. The test scenario comprises a weather rendering model, a road model, a traffic facility models, a roadside building model, and other traffic participants.

1) Weather rendering model: light rendering of a sunny day, a rainy day, a snowy day, a foggy day, a sandstorm day and a lighting day, and so on can be achieved.

2) Road model: a main part of a road may include a single lane, multiple lanes, or a ramp, etc.; an intersection may include a cross junction, a T-junction, a special-shaped junction, or an entrance or exit of a highway or an ordinary road, etc.; features of the road may include cement pavement, sand and gravel pavement, or asphalt pavement, etc.

3) Traffic facility model: including traffic signs, markings, and signal lights. The traffic signs may include signs about speed limit, stopping to give way, paying attention to pedestrians, and reduction in front vehicles; the traffic markings may include crosswalk lines, lane edge lines, lane center lines, lane dividing lines, stopping lines, deceleration lines, etc.; and the signal lights may include lane lights, direction indicators, etc.

4) Roadside building model: it can customize buildings and scenery elements on both sides of the road for a scenario, including fields, bridges, rural buildings, urban buildings, etc., and can also support importing of a file with a 3D format, so as to restore a real road scenario.

5) Other traffic participants: including vehicles, pedestrians, bicycles, etc., and the cloud control platform obtains data from the other traffic participants by connecting with roadside facilities to optimize vehicle driving safety and traffic operation efficiency.

The vehicle dynamics simulation platform is mainly configured to simulate a response of a vehicle to a driver, a pavement and an aerodynamic input, and to predict and simulate handling stability, braking performance and dynamic performance of a vehicle. The vehicle dynamics simulation platform may include a body dynamics module, a suspension system module, a steering system module, and a tire module.

The sensor simulation platform is mainly configured to simulate output of different types of sensors, mainly including two types of sensors, a vehicle-mounted sensor and a roadside sensor, which generally may be a vision sensor, a lidar, a millimeter-wave radar, and an ultrasonic radar. The vehicle-mounted sensor enables an intelligent connected vehicle's perception of its surrounding environment on the road to assist the vehicle in path planning decision and motion control; the roadside sensor mainly implements functions such as vehicle-road interconnection, environmental perception, and locally assisted positioning. When configuring output of the sensors, it is necessary to add some features, such as noise, distortion, chromatic aberration or the like in addition to some basic functions.

The cloud control communication component simulation platform is mainly configured to build a communication network for the cloud control platform under test, including a roadside infrastructure network, a wireless access network, a core network, a metropolitan area network, and a backbone network, etc. The cloud control platform incorporates a heterogeneous communication network and uses a standardized communication mechanism to realize extensive communication among intelligent connected vehicles, roadside equipment and the cloud control platform. The wireless access network may include a vehicle-to-road communication network and a vehicle-to-vehicle direct connection network to realize vehicle intercommunication and vehicle access to an edge cloud; and the roadside equipment is connected with various levels of clouds of the cloud control platform through a wired network.

The real-time simulator is a core component of the hardware-in-the-loop simulation system. It is configured to calculate a model of a controlled object (including a vehicle dynamics model, a traffic scenario simulation model and a sensor model), and is responsible for communication between the cloud control platform and respective interface boards. The real-time simulator can not only realize the communication between the computing platform and the interface boards, but also undertake data exchange between multi-core and multi-processor systems.

The cloud control platform under test is connected to the above-mentioned modules through real signals to form a closed-loop test system.

Based on the above-mentioned hardware-in-the-loop test system depending on the cloud control platform, a hardware-in-the-loop test can be carried out on the cloud control platform, where the road traffic scenario simulation platform can built multiple types of roads, multiple types of traffic signs and markings, multiple types of roadside buildings, multiple types of traffic participants and complex traffic scenarios with different weather conditions, and has higher test scenario building efficiency, which solves the problems of difficulties in building a complex scenario, lower test efficiency, and higher cost in the real vehicle test. Moreover, the test scenario built based on the platform can be saved so as to realize repeatable test cases and test scenarios, which solves the problems of unrepeatable test scenarios in the real vehicle test. In addition, the real-time simulator in the test system realizes real-time communication between the cloud control platform and various interface boards, which solves the problems of a big difference between real-time capability and actual operation of the system in the simulation test, and various interface versions of the real-time simulator can realize simulation of various signal types, such as Controller Area Network (CAN), Local Interconnect Network (LIN), Ethernet, serial port, etc., to realize real signal connection for the software and hardware test system of the cloud control platform, thereby test authenticity and credibility can be greatly improved.

A hardware-in-the-loop test process depending on the cloud control platform, as shown in FIG. 3, includes the following steps: Step 1: building a hardware-in-the-loop test environment depending on a cloud control platform according to a cloud control platform system architecture; Step 2: designing a test case and building a test scenario according to a function to be realized by the control platform; Step 3: injecting the test scenario, executing a test, and collecting relevant parameters, wherein the relevant parameters include a related parameter of vehicle driving safety, traffic operation efficiency and function completion degree of the cloud control system, etc.; and Step 4: performing a test evaluation on the function realized by the cloud control platform.

The following is a detailed description of the above test process:

Step 1: a hardware-in-the-loop test environment depending on a cloud control platform is built according to a cloud control platform system architecture. The test environment may include: a road traffic scenario simulation platform, a vehicle dynamics simulation platform, a sensor simulation platform, a cloud control communication component simulation platform, a real-time simulator, and a cloud control platform under test.

The road traffic scenario simulation platform sends map information, weather information, traffic flow information, autonomous vehicles' and other traffic participants' location information simulated by the road traffic scenario simulation platform to the real-time simulator via Ethernet. The vehicle dynamics simulation platform sends movement information of the autonomous vehicles and the other traffic participants to the real-time simulator via Ethernet. Similarly, the sensor simulation platform sends output information of sensors arranged on the vehicles and roadside equipment to the real-time simulator via Ethernet. After that, the real-time simulator sends such relevant information to the cloud control platform under test through a cloud control communication component via a wired network or a wireless network. The cloud control platform under test, after receiving the relevant information, outputs coordinated control information for the vehicles and the other traffic participants and request information, and sends them to the vehicles and the other traffic participants through a wired network or a wireless network. This constitutes a closed-loop test system.

Step 2: a test case is designated and a test scenario is built according to a function to be realized by the control platform. The main function of the cloud control system may include an intelligent driving function for improving driving safety and driving efficiency, a traffic function for improving traffic efficiency and performance, and a function related to vehicle and traffic big data. According to service objects of the cloud control platform, the function may be divided into a function serving a specific vehicle and a function serving a specific road area. In the present application, a test case and a test scenarios are designed by taking a related function serving intelligent driving in a specific road area as an example.

The present application takes a function of intelligent driving traffic light assisted travel as an example. The cloud control platform merges sensor data of the roadside sensor and the vehicle-mounted sensor to obtain accurate position and movement information of vehicles as well as status and position information of traffic lights, then uses the information in combination with traffic capacity of a current road and information about a traveled path of each of the vehicles to calculate an expected travel path and travel speed of each of the vehicles, and convert the same to a vehicle control instruction to send it to the intelligent connected vehicles through the cloud control communication component and the real-time simulator. The intelligent connected vehicles then execute the same instruction. In order to achieve verification of the function, it is necessary to set different service levels for the road according to different time periods so as to place different numbers of vehicles and generate different test cases, as shown in Table 1 below.

TABLE 1

| | | Division of test cases | | | |
|---|---|---|---|---|---|
| Time period | Morning peak (07:00-9:00) | Evening peak (17:00-20:00) | Off-peak of the day (9:00-17:00) | Off-peak of the evening (20:00-24:00) | Night (0:00-7:00) |
| Service level | $3^{th}$ service level | $3^{th}$ service level | $2^{nd}$ service level | $2^{nd}$ service level | $1^{st}$ service level |

Note:
a congestion degree and a service level of a road may be usually divided into the following four levels according to a saturation value:
$1^{st}$ service level: smooth traffic, good service level, V/C is between 0 and 0.6;
$2^{nd}$ service level: road congestion, higher service level, V/C is between 0.6 and 0.8;
$3^{rd}$ service level: road congestion, poorer service level, V/C is between 0.8 and 1.0;
$4^{th}$ service level: severe road congestion, extremely poor service level, V/C > 1.0;
where V is a maximum traffic volume, and C is a maximum traffic capacity.

Figure 4:
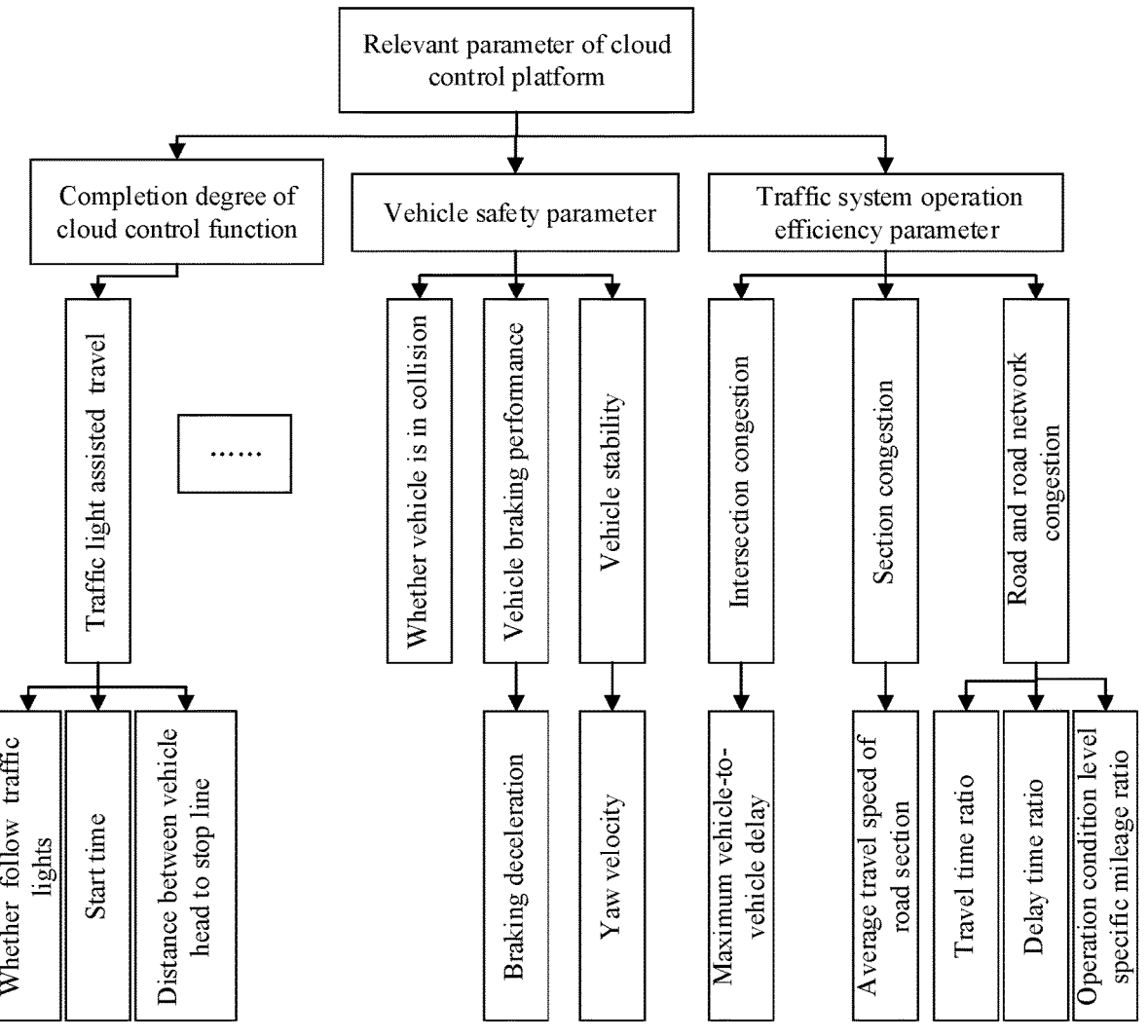
FIG. 4 is a schematic diagram of related parameters of a cloud control platform according to an embodiment of the present application.

Step 3: the test scenario is injected, a test is performed, and relevant parameters are collected. The operation parameters of the cloud control platform may include the following three aspects: a cloud control function completion degree parameter, a vehicle safety parameter, and a traffic system operation efficiency parameter. FIG. 4 can be referred for a schematic diagram of the related parameters of the cloud control platform.

Regarding evaluation of the cloud control function completion degree, it takes a function of traffic light assisted travel as an example, and in such case, an evaluation related with a traffic light is conformable to the following regulations:

(1) If a vehicle does not operates correctly according to the requirements of the traffic light, the function is failed;

(2) If a vehicle does not start within 2 s since a green light is turned on, the function is failed;

(3) If a vehicle, when waiting upon a red light, has a distance of its vehicle head from to a stop line greater than 1 m, the function is failed; if the distance from the vehicle head to the stop line is greater than 0.5 m but less than 1 m, the function completion degree is determined to be 50%.

Regarding evaluation of the safety, it includes an evaluation of vehicle collision, vehicle braking performance, and vehicle body stability. The vehicle braking performance is generally evaluated by using braking deceleration, that is, whether the braking deceleration is less than a certain limit; the vehicle stability is generally evaluated by using lateral acceleration and yaw velocity, that is, whether the lateral acceleration or yaw velocity is less than a certain limit.

Regarding evaluation of the traffic system operational efficiency, it generally evaluates a traffic congestion degree.

The traffic congestion degree mainly includes an intersection congestion degree, a road section congestion degree, and a road and road network traffic congestion degree.

(1) The intersection congestion degree is generally evaluated by a maximum average vehicle delay. The average vehicle delay at an intersection refers to an average time loss incurred by vehicles in a process of passing through the intersection. The maximum average vehicle delay may be calculated by the following formula (1):

$$\overline{D}_{max} = \max\{\overline{d_1}, \overline{d_2}, \wedge, \overline{d_i}, \wedge, \overline{d_n}\} \tag{1}$$

In the formula (1): $\overline{D}_{max}$ represents the maximum average vehicle delay, with unit of second (s); $d_i$ represents an average vehicle delay on a $i^{th}$ entrance lane within a certain time interval, with unit of second (s); and n represents a total number of entrance lanes.

(2) The road section congestion degree is evaluated by using an average travel speed. The average travel speed refers to an average vehicle speed between two end points of a road section. The average travel speed of a road section may be calculated by the following formula (2):

$$v = \frac{nL}{\sum_{i=1}^{n} t_i} \tag{2}$$

In the formula (2): $\overline{v}$ represents an average travel speed in a road section, with unit of kilometers per hour (km/h); L represents a length of the road section, excluding intersections, with unit of kilometer (km); $t_i$ represents a time period required for a vehicle i to pass through the road section, with unit of hour (h); n represents the number of vehicles to be measured.

(3) The road and road network traffic congestion degree is evaluated by using a travel time ratio, a delay time ratio and an operating condition level specific mileage ratio.

The travel time ratio refers to a ratio of an actual travel time to a free flow travel time, and may be calculated by the following formula (3):

$$TTI_{kj} = \frac{\overline{t}_{kj}}{t_j^f} \tag{3}$$

In the formula (3): $TTI_{kj}$ represents a travel time ratio of a road section j within a time interval, the time interval should not be greater than 15 min (0.25 h); $\overline{t}_{kj}$ represents an actual travel time, $t_j^f$ and represents a travel time of the road section j in a free flow state, with unit of hour (h);

The delay time ratio refers to a ratio of a delay time to an actual travel time, and may be calculated by the following formula (4):

$$DTP_{kj} = \frac{\bar{t}_{kj} - t_j^f}{\bar{t}_{kj}} \tag{4}$$

In the formula (4): $\bar{t}_{kj}$ represents an average time of vehicles to travel across a road segment j within a time interval k, $$\bar{t}_{kj} = \frac{\sum_{j=1}^{n} t_{kji}}{n} \text{ or } \bar{t}_{kj} = \frac{L_j}{V_{kj}},$$

where n is the number of the vehicles, with unit of hour (h); and $t_j^f$ represents a travel time of the road section j in a free flow state, with unit of hour (h).

The operating condition level specific mileage ratio refers to a ratio of a mileage of road sections at a specific traffic operating condition level to a total road mileage, and may be calculated by the following formula (5):

$$DP_{ki} = \frac{\sum_{j=1}^{M} m_{kji}}{\sum_{j=1}^{n} L_j} \times 100\% \tag{5}$$

In the formula (5): $DP_{ki}$ represents a mileage percentage of a road at a specific operating condition level i within a time interval k, where i is a traffic operating condition level determined in Table 3; $m_{kji}$ represents a mileage of road sections j at the operating condition level i within the time interval k, with unit of kilometer (km), and the time interval should not be greater than 15 min (0.25 h); n represents the number of road segments included in the road; $L_j$ represents a total mileage of the road within an evaluation range, with unit of kilometers (km).

Step 4: a test evaluation on the function realized by the cloud control platform is performed. That is, a comprehensive evaluation is carries out by designing weights of various operating parameters according to those operating parameters of the cloud control system. The evaluation of the cloud control platform needs to consider three aspects of parameters: the cloud control function completion degree, the cloud control system safety and the traffic system efficiency. According to evaluation scores of the various aspects, a comprehensive evaluation score of the cloud control system is obtained based on addition with various weights. It may be calculated by the following formula (6):

$$K = f_1 K_1 + f_2 K_2 + f_3 K_3 \tag{6}$$

In the formula (6), K represents the comprehensive evaluation score of the cloud control system, $K_1$ represents an evaluation score of the cloud control function completion degree, $K_2$ represents an evaluation score of the vehicle safety, and $K_3$ represents an evaluation score of the traffic system efficiency, where each of $K_1$, $K_2$, and $K_3$ ranges from 0 to 100; and $f_1$ represents a weight coefficient of the cloud control function completion degree, $f_2$ represents a weight coefficient of the vehicle safety, and $f_3$ represents a weight

12 coefficient of the traffic system efficiency, where $f_1 + f_2 + f_3 = 1$, and since $f_1$, $f_2$ and $f_3$ are equally important for the operation evaluation of the cloud control system according to the embodiment of the present application, it may be that $f_1 = f_2 = f_3 = \frac{1}{3}$.

The evaluation score of the cloud control function completion degree may be calculated by the following formula (7):

$$K_1 = f_{1a} K_{1a} + f_{1b} K_{1b} + \ldots + f_{1n} K_{1n} \tag{7}$$

In the formula (7), $K_1$ is the comprehensive evaluation score of the cloud control function completion degree, $K_{1a}, \ldots, K_{1n}$ are evaluation scores of respective functions of the cloud control system. Taking the traffic light assisted function as an example, $K_{1a}$ may be calculated by $K_{1a} = J_{1a} * J_{1b} * J_{1c} * 100$, where $J_{1a} = 0$ when a vehicle does not perform operations as required by the traffic light, and $J_{1a} = 1$ for other conditions; $J_{1b} = 0$ when a vehicle does not start within 2 s since a green light is turned on, and $J_{1b} = 1$ for other conditions; $J_{1c} = 0$ when a vehicle, when waiting upon a red light, has a distance greater than 1 m from its vehicle head to a stop line, $J_{1c} = 0.5$ when the vehicle has a distance from its vehicle head to the stop line greater than 0.5 but smaller than 1 m, and $J_{1c} = 1$ for other conditions. The $f_{1a}, \ldots, f_{1n}$ are weight coefficients of various functions, each of which may be determined according a percentage of a running time period of the function with respect to a running time period of the autonomous driving, and $f_{1a} + f_{1b} + \ldots + f_{1n} = 1$. In addition, regarding the evaluation of the cloud control function completion degree, it requires that every vehicles in the system should be evaluated separately, and then an average completion score is obtained.

The evaluation score of the vehicle safety may be calculated by the following formula (8):

$$K_2 = 100 * f_{2a} * (f_{2b} + f_{2c}) * \frac{1}{2} \tag{8}$$

In the formula (8), $K_2$ is the evaluation score of the vehicle safety, $f_{2a}$ represents a weight coefficient indicating whether a vehicle is in a collision, and $f_{2a} = 0$ when the vehicle is in a collision, or otherwise $f_{2a} = 1$; $f_{2b}$ is a weight coefficient indicating whether the vehicle's longitudinal deceleration meets requirements, and $f_{2b} = 1$ if it meets the requirements, or otherwise $f_{2b} = 0$; and $f_{2c}$ is a weight coefficient indicating whether the vehicle's yaw velocity meets requirements, and $f_{2c} = 1$ if it meets the requirements, or otherwise $f_{2c} = 0$. Similarly, regarding the evaluation of the vehicle safety, it requires that every vehicles in the system should be evaluated separately, and then an average is obtained.

The evaluation score of the traffic system operation efficiency may be calculated by the following formula (9):

$$K_3 = f_{3a} K_{3a} + f_{3b} K_{3b} + f_{3c} K_{3c} \tag{9}$$

In the formula (9), $K_3$ is the evaluation score of the traffic system operation efficiency, $f_{3a}$ represents a weight coefficient of the intersection congestion degree, $f_{3b}$ represents a weight coefficient of the section traffic congestion degree, $f_{3c}$ represents a weight coefficient of the road and road network congestion degree; $K_{3a}$ represents a score of the intersection congestion degree, $K_{3b}$ represents a score of the section traffic congestion degree, and $K_{3c}$ represents a score of the road and road network congestion degree.

A correspondence relationship between traffic congestion degrees and maximum average vehicle delays at an intersection is shown in Table 2 below. In the traffic system, a maximum average vehicle delay at each traffic light controlled intersection corresponds to a corresponding traffic congestion degree. A corresponding score for smooth traffic is 100, for mild congestion is 60, for moderate congestion is 40, and for severe congestion is 20. The congestion degree scores for respective traffic light controlled intersections are averaged, which may be calculated by the following formula (10):

$$K_{3a} = \frac{J_1 + J_2 + \dots + J_n}{n} \qquad (10)$$

In the formula (10), n is the number of intersections; and $J_1, \dots, J_n$ represent scores of the traffic congestion degrees at respective intersections.

TABLE 2

Correspondence between maximum average vehicle delays and traffic congestion degrees at an intersection

| Maximum average vehicle delay $\overline{D}_{max}$ (s) | [0, 55) | [55, 100) | [100, 55) | ≥145 |
|---|---|---|---|---|
| Traffic congestion degree | Smooth traffic | Mild congestion | Moderate congestion | Severe congestion |

A corresponding relationship between average travel speeds of various road sections and traffic congestion degrees under different speed limit conditions of urban an arterial roads or a sub-arterial road is shown in Table 3 below. In the traffic system, an average travel speed of each road section corresponds to a corresponding traffic congestion degree. Similarly, a corresponding score for smooth traffic is 100, for mild congestion is 60, for moderate congestion is 40, and for severe congestion is 20. The congestion degree scores of respective road sections are averaged, which may be calculated by the following formula (11):

$$K_{3b} = \frac{Q_1 + Q_2 + \dots + Q_n}{n} \qquad (11)$$

In the formula (11), n is the number of intersections; and $Q_1, \dots, Q_n$ represent scores of the traffic congestion degrees for respective road sections.

TABLE 3

Correspondence between average travel speeds and traffic congestion degrees of road sections of an urban arterial road or a sub-arterial road

| Speed limit | | Average travel speed | | |
|---|---|---|---|---|
| 80 | ≥45 | [30, 45) | [20, 30) | [0, 20) |
| 70 | ≥40 | [30, 40) | [20, 30) | [0, 20) |
| 60 | ≥35 | [30, 35) | [20, 30) | [0, 20) |
| 50 | ≥30 | [25, 30) | [15, 25) | [0, 15) |
| 40 | ≥25 | [20, 25) | [15, 20) | [0, 15) |
| <40 | [25, speed limit) | [20, 25) | [10, 20) | [0, 10) |
| Traffic congestion degree | Smooth traffic | Mild congestion | Moderate congestion | Severe congestion |

A corresponding relationship between severe congestion mileages and traffic congestion degrees of an urban road network, a corresponding relationship between travel time ratios and traffic congestion degrees of the road network, and a corresponding relationship between delay time ratios and traffic congestion degrees of the road network are respectively shown in the following tables: Table 4, Table 5, and Table 6. Similarly, a corresponding score for smooth traffic is 100, for approaching traffic smooth is 80, for mild congestion is 60, for moderate congestion is 40, and for severe congestion is 20. The scores of travel time ratios and the delay time rations of respective sections are averaged, and then together with a score of a sever congestion mileage ratio of the urban road network, are summed with respective weights, which may be calculated by the following formula (12):

$$K_{3c} = f_{3c1}T_1 + f_{3c2}T_2 + f_{3c3}T_3 \qquad (12)$$

In the formula (12), $T_1$ is an evaluation score of the sever congestion mileage ratio of an urban road network, $T_2$ is an evaluation score of the travel time ratio of the urban road network, $T_3$ is an evaluation score of the delay time ratio of the urban road network, $f_{3c1}$ represents a weight coefficient for the sever congestion mileage ratio, $f_{3c2}$ represents a weight coefficient for the travel time ratio of the urban road network, and $f_{3c3}$ represents a weight coefficient for delay time ratio of the urban road network.

TABLE 4

Correspondence between sever congestion mileage ratios and traffic congestion degrees of an urban road network

| Sever congestion mileage ratio | [0, 4%) | [4%, 8%) | [8%, 11%) | [11%, 14%) | [14%, +∞] |
|---|---|---|---|---|---|
| Traffic congestion degree | Smooth traffic | Approaching smooth traffic | Mild congestion | Moderate congestion | Severe congestion |

TABLE 5

Correspondence between travel time ratios and traffic congestion degrees of the road network

| Travel time ratio(TTI) | [1, 1.3) | [1.3, 1.6) | [1.6, 1.9) | [1.9, 2.2) | [2.2, +∞] |
|---|---|---|---|---|---|
| Traffic congestion degree | Smooth traffic | Approaching smooth traffic | Mild congestion | Moderate congestion | Severe congestion |

TABLE 6

| Correspondence between delay time ratios and traffic congestion degrees of the road network | | | | | |
|---|---|---|---|---|---|
| Delay time ratio(DTP) | [0, 0.3) | [0.3, 0.5) | [0.5, 0.6) | [0.6, 0.7) | [0.7, 1] |
| Traffic congestion degree | Smooth traffic | Approaching smooth traffic | Mild congestion | Moderate congestion | Severe congestion |

In the embodiment, by establishing a hardware-in-the-loop test system for the cloud control platform, it files a blank of a semi-physical simulation test of the cloud control platform is filled, and realizes a real-time test of the cloud control platform when used in a complex traffic scenario and a complex communication process, and solves the problems in a traditional test method of low test efficiency, high cost, unrepeatable test scenarios, unsatisfactory real-time requirements, and insufficient credibility, and thus improves efficiency of iterative development of the cloud control platform. The embodiment establishes a method for performing test evaluation of the cloud control platform, which realizes a multi-angle evaluation of the cloud control platform through a comprehensive evaluation of the cloud control platform's function completion degree, driving safety and traffic operation efficiency, and improves credibility of the test evaluation.

Figure 5:
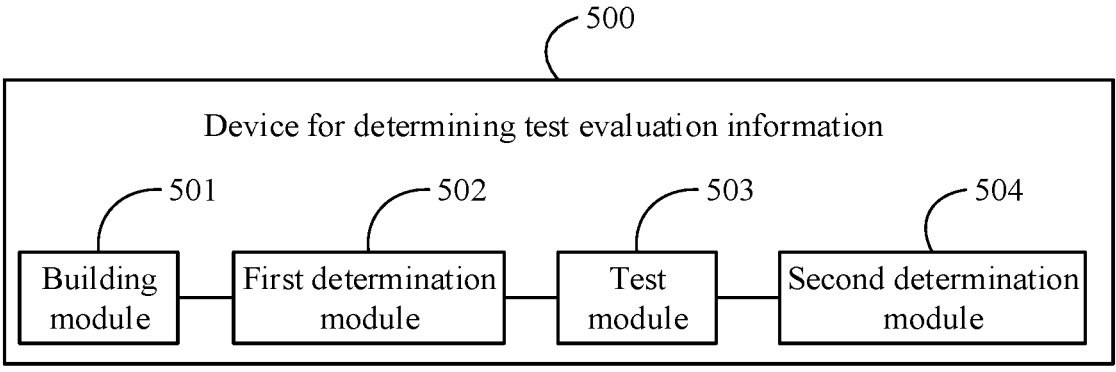
FIG. 5 is a schematic structural diagram of a device for determining test evaluation information according to an embodiment of the present application.

As shown in FIG. 5, the embodiments of the present application also provide a device for determining test evaluation information, and the device 500 for determining test evaluation information includes:

a building module 501 configured to build a hardware-in-the-loop test environment, wherein the hardware-in-the-loop test environment comprises a cloud control platform under test, a road traffic scenario simulation platform, and a real-time simulator, and wherein the road traffic scenario simulation platform is configured to build a variety of road traffic scenarios, the real-time simulator is configured to realize communication between the cloud control platform under test and respective interface boards;

a first determination module 502 configured to determine a test scenario according to a function to be realized by the cloud control platform under test;

a test module 503 configured to perform a test operation on the cloud control platform under test based on the hardware-in-the-loop test environment and the test scenario, and collect functional parameters of the cloud control platform under test; and a second determination module 504 configured to determine test evaluation information of the cloud control platform under test based on the functional parameters.

In an embodiment, the hardware-in-the-loop test environment may further include a vehicle dynamics simulation platform configured to simulate a response of a vehicle to a driver, a road surface and an aerodynamic input, and to predict and simulate handling stability, braking performance and dynamic performance of the vehicle.

In an embodiment, the hardware-in-the-loop test environment may further include a sensor simulation platform configured to simulate output of different types of sensors.

In an embodiment, the different types of sensors may include a vehicle-mounted sensor and a roadside sensor.

In an embodiment, the hardware-in-the-loop test environment may further include a cloud control communication component simulation platform configured to build a communication network for the cloud control platform under test.

In an embodiment, the functional parameters may include a vehicle driving safety parameter, a traffic operation efficiency parameter and a cloud control system function completion degree parameter.

In an embodiment, the first determination module 502 may include:

a first determination unit configured to determine a test case according to the function to be realized by the cloud control platform under test; and a second determination unit configured to determine a corresponding test scenario according to the test case.

The modules/units in the device shown in FIG. 5 have functions for implementing the steps in FIG. 1 and can achieve the same technical effects. For sake of brevity, they are not repeated here.

Figure 6:
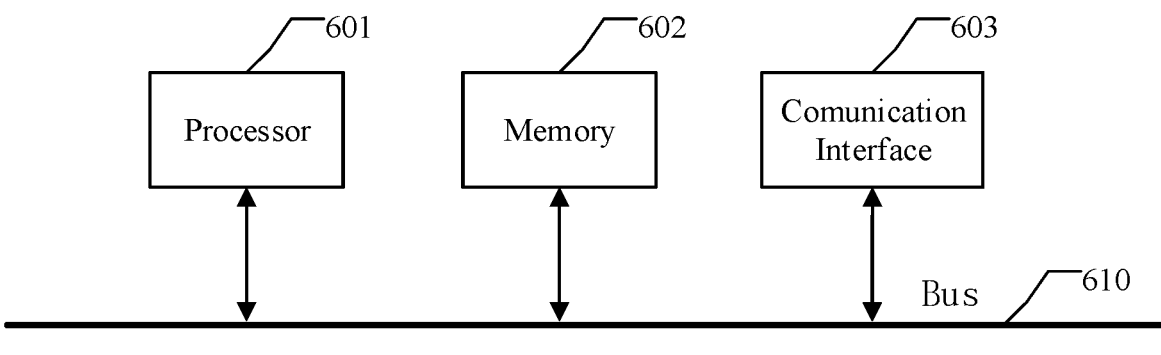
FIG. 6 is a schematic structural diagram of an electronic device according to an embodiment of the present application.

FIG. 6 shows a schematic structural diagram of an electronic device according to an embodiment of the present application.

The electronic device may include a processor 601 and a memory 602 storing computer program instructions.

Specifically, the processor 601 may include a central processing unit (CPU), or a specific integrated circuit (Application Specific Integrated Circuit, ASIC), or may be configured as one or more integrated circuits that implement the embodiments of the present application.

The memory 602 may include a mass storage for data or instructions. By way of an example rather than limitation, the memory 602 may include a hard disk drive (Hard Disk Drive, HDD), a floppy disk drive, a flash memory, an optical disk, a magneto-optical disk, a magnetic tape, or a universal serial bus (Universal Serial Bus, USB) drive, or any combination of two or more of these devices. The memory 602 may include a removable or non-removable (or fixed) medium where appropriate. The memory 602 may be internal or external to the electronic device where appropriate. In particular embodiments, the memory 602 may be a nonvolatile solid-state memory.

In an example, the memory 602 may be a read only memory (Read Only Memory, ROM). In one example, the ROM may be mask-programmed ROM, programmable ROM (PROM), erasable PROM (EPROM), electrically erasable PROM (EEPROM), electrically rewriteable ROM (EAROM), or flash memory or any combination of two or more of these devices.

The processor 601 reads and executes the computer program instructions stored in the memory 602 to implement any method for determining test evaluation information in the foregoing embodiments.

In an example, the electronic device may further include a communication interface 603 and a bus 610. A shown in FIG. 6, the processor 601, the memory 602, and the communication interface 603 are connected through the bus 610 and perform mutual communication.

The communication interface 603 is primarily used to implement communication between various modules, components, units and/or devices in the embodiments of the present application.

The bus 610 includes hardware, software, or the both, and couples components of the online data traffic accounting device to each other. By way of an example rather than limitation, the bus may include an Accelerated Graphics Port (AGP) or other graphics bus, an Enhanced Industry Standard Architecture (EISA) bus, a Front Side Bus (FSB), a Hypertransport (HT) interconnect, an Industry Standard Architecture (ISA) bus, an infinite bandwidth interconnection, a Low Pin Count (LPC) bus, a memory bus, a Micro Channel Architecture (MCA) bus, a Peripheral Component Interconnect (PCI) bus, a PCI-Express (PCI-X) bus, a Serial Advanced Technology Attachment (SATA) bus, a Video Electronics Standards Association Local (VLB) bus or any other suitable bus or a combination of two or more of these buses. The bus 610 may include one or more buses where appropriate. Although the embodiments of this application are described with a particular bus, the application may consider any suitable bus or interconnection.

In addition, the embodiments of the present application may provide a computer storage medium for implementation. The computer storage medium stores computer program instructions, and the computer program instructions are executed by the processor to implement any method for making determining test evaluation information in the foregoing embodiments.

Examples of the computer storage medium may include a non-transitory computer-readable storage medium, such as a ROM, a random access memory (Random Access Memory, RAM), a magnetic disks, or an optical disk.

It should be clear that the present application is not limited to the specific configuration and processing described above and shown in the figures. For sake of brevity, a detailed description of any known method has been omitted here. In the above embodiments, several specific steps are described and shown as examples. However, the method process of the present application is not limited to the specific steps described and shown. After understanding the spirit of the present application, those skilled in the art can make various changes, modifications and additions, or change the sequence between the steps.

The functional modules shown in the above-mentioned structural block diagram can be implemented as hardware, software, firmware, or a combination thereof. When implemented in hardware, it can be, for example, an electronic circuit, an application specific integrated circuit (ASIC), appropriate firmware, a plug-in, a function card, and so on. When implemented in software, the elements of the application are programs or code segments used to perform required tasks. The programs or code segments may be stored in a machine-readable medium, or transmitted on a transmission medium or a communication link through a data signal carried in carrier waves. "Machine-readable medium" may include any medium that can store or transmit information. Examples of machine-readable media may include an electronic circuit, a semiconductor memory device, a ROM, a flash memory, an erasable ROM (EROM), a floppy disk, a CD-ROM, an optical disk, a hard disk, a fiber optic medium, a radio frequency (RF) link, and so on. The code segments may be downloaded via a computer network such as the Internet, an intranet, and so on.

It should also be noted that the exemplary embodiments mentioned in the application describe some methods or systems based on a series of steps or devices. However, the present application is not limited to the order of the above steps, that is, the steps may be executed in the order mentioned in the embodiments, or may be executed in a different order than the embodiments, or several steps may be executed simultaneously.

The above describes various aspects of the present application with reference to the flowcharts and/or block diagrams of the methods, devices (systems) and computer program products according to the embodiments of the present application. It should be understood that each block in the flowcharts and/or block diagrams and combinations of blocks in the flowcharts and/or block diagrams may be implemented by computer program instructions. These computer program instructions can be provided to a processor of a general-purpose computer, a special-purpose computer, or any other programmable data processing device to produce a machine that enables the processor of the computer or any other programmable data processing device to execute the instructions to implement the functions/actions specified in one or more blocks of the flowcharts and/or block diagrams. Such a processor may be, but is not limited to, a general-purpose processor, a dedicated processor, a special application processor, or a field programmable logic circuit. It should also be understood that each block in the block diagram and/or flowchart and the combination of the blocks in the block diagram and/or flowchart may also be implemented by dedicated hardware that performs the specified functions or actions, or may be implemented by a combination of dedicated hardware and computer instructions.

The above descriptions are only specific implementations of the present application, and those skilled in the art can clearly understand that for convenience and conciseness of description, the specific working process of the above-described systems, modules and units may refer to the foregoing method embodiments, and is not repeated here. It should be understood that the scope of the application is not limited to the embodiments, and those skilled in the art can easily anticipate various equivalent modifications or substitutions within the technical scope of the application, and all of these modifications or substitutions fall within the scope of the present application.

What is claimed is:

1. A method for determining test evaluation information, comprising:
building a hardware-in-the-loop test environment, wherein the hardware-in-the-loop test environment comprises a cloud control platform under test, a road traffic scenario simulation platform, and a real-time simulator, and wherein the road traffic scenario simulation platform is configured to build a variety of road traffic scenarios, the real-time simulator is configured to realize communication between the cloud control platform under test and respective interface boards;
determining a test scenario according to a function to be realized by the cloud control platform under test;
performing a test operation on the cloud control platform under test based on the hardware-in-the-loop test environment and the test scenario, and collecting functional parameters of the cloud control platform under test; and
determining test evaluation information of the cloud control platform under test based on the functional parameters.

2. The method for determining test evaluation information according to claim 1, wherein the hardware-in-the-loop test environment further comprises a vehicle dynamics simulation platform configured to simulate a response of a vehicle to a driver, a road surface and an aerodynamic input, and to predict and simulate handling stability, braking performance and dynamic performance of the vehicle.

3. The method for determining test evaluation information according to claim 1, wherein the hardware-in-the-loop test environment further comprises a sensor simulation platform configured to simulate output of different types of sensors.

4. The method for determining test evaluation information according to claim 3, wherein the different types of sensors comprises a vehicle-mounted sensor and a roadside sensor.

5. The method for determining test evaluation information according to claim 1, wherein the hardware-in-the-loop test environment further comprises a cloud control communication component simulation platform configured to build a communication network for the cloud control platform under test.

6. The method for determining test evaluation information according to claim 1, wherein the functional parameters comprises a vehicle driving safety parameter, a traffic operation efficiency parameter and a cloud control system function completion degree parameters.

7. The method for determining test evaluation information according to claim 1, wherein the determination of the test scenario according to the function to be realized by the cloud control platform under test comprises:

determining a test case according to the function to be realized by the cloud control platform under test; and determining a corresponding test scenario according to the test case.

8. A device for determining test evaluation information, comprising:

a building circuitry configured to build a hardware-in-the-loop test environment, wherein the hardware-in-the-loop test environment comprises a cloud control platform under test, a road traffic scenario simulation platform, and a real-time simulator, and wherein the road traffic scenario simulation platform is configured to build a variety of road traffic scenarios, the real-time simulator is configured to realize communication between the cloud control platform under test and respective interface boards;

a first determination circuitry configured to determine a test scenario according to a function to be realized by the cloud control platform under test;

a test circuitry configured to perform a test operation on the cloud control platform under test based on the hardware-in-the-loop test environment and the test scenario, and collect functional parameters of the cloud control platform under test; and a second determination circuitry configured to determine test evaluation information of the cloud control platform under test based on the functional parameters.

9. The device for determining test evaluation information according to claim 8, wherein the hardware-in-the-loop test environment further comprises a vehicle dynamics simulation platform configured to simulate a response of a vehicle to a driver, a road surface and an aerodynamic input, and to predict and simulate handling stability, braking performance and dynamic performance of the vehicle.

10. The device for determining test evaluation information according to claim 8, wherein the hardware-in-the-loop test environment further comprises a sensor simulation platform configured to simulate output of different types of sensors.

11. The device for determining test evaluation information according to claim 10, wherein the different types of sensors comprises a vehicle-mounted sensor and a roadside sensor.

12. The device for determining test evaluation information according to claim 8, wherein the hardware-in-the-loop test environment further comprises a cloud control communication component simulation platform configured to build a communication network for the cloud control platform under test.

13. The device for determining test evaluation information according to claim 8, wherein the functional parameters comprises a vehicle driving safety parameter, a traffic operation efficiency parameter and a cloud control system function completion degree parameter.

14. The device for determining test evaluation information according to claim 8, wherein the first determination circuitry comprises:

a first determination unit configured to determine a test case according to the function to be realized by the cloud control platform under test; and a second determination unit configured to determine a corresponding test scenario according to the test case.

15. An electronic device, comprising:

a processor; and a memory storing computer program instructions, wherein the processor is configured to execute the computer program instructions to perform the method for determining test evaluation information according to claim 1.

16. A non-transitory computer storage medium having computer program instructions stored thereon, wherein the computer program instructions are executed by a processor to perform the method for determining test evaluation information according to claim 1.

\* \* \* \* \*